(12) United States Patent
Mohan et al.

(10) Patent No.: US 10,615,482 B2
(45) Date of Patent: Apr. 7, 2020

(54) AMPLIFIER ASSEMBLIES WITH MULTIPLE ANTENNA STRUCTURES AND AMPLIFIERS

(71) Applicant: Qorvo US, Inc., Greensboro, NC (US)

(72) Inventors: Ankush Mohan, Thousand Oaks, CA (US); Dan Denninghoff, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/933,783

(22) Filed: Mar. 23, 2018

(65) Prior Publication Data

US 2019/0068140 A1 Feb. 28, 2019

Related U.S. Application Data

(60) Provisional application No. 62/548,447, filed on Aug. 22, 2017, provisional application No. 62/548,448, (Continued)

(51) Int. Cl.
*H03F 3/68* (2006.01)
*H01P 5/12* (2006.01)
(Continued)

(52) U.S. Cl.
CPC .................. *H01P 5/12* (2013.01); *H01P 1/22* (2013.01); *H01P 3/06* (2013.01); *H01Q 1/50* (2013.01);
(Continued)

(58) Field of Classification Search
CPC .... H01P 5/12; H01P 5/107; H01P 1/22; H01P 3/06; H03H 11/04; H03H 2011/0488; H04B 1/0458; H04B 7/0613; H01Q 13/08; H01Q 21/0006; H01Q 21/0025; H01Q 1/50; H03F 2200/451; H03F 2200/315; H03F 3/211;
(Continued)

(56) References Cited

U.S. PATENT DOCUMENTS 3,023,382 A    2/1962 Borghetti
4,234,854 A *  11/1980 Schellenberg .......... H03F 3/602
                                                   330/286
(Continued)

OTHER PUBLICATIONS

Author Unknown, "Interpack 2005: An assessment for PMMI members," 2005, PMMI, 32 pages.
(Continued)

*Primary Examiner* — Khanh V Nguyen
(74) *Attorney, Agent, or Firm* — Withrow & Terranova, P.L.L.C.

(57) ABSTRACT

Spatial power-combining devices with increased output power are disclosed. A spatial power-combining device includes a plurality of amplifier assemblies and each of the amplifier assemblies includes a plurality of amplifiers separately coupled to a plurality of antennas. An amplifier assembly includes a first amplifier sub-assembly and a second amplifier sub-assembly. The first amplifier sub-assembly includes a first amplifier, a first input antenna structure coupled to the first amplifier, and a first output antenna structure coupled to the first amplifier. The second amplifier sub-assembly includes a second amplifier, a second input antenna structure coupled to the second amplifier, and a second output antenna structure coupled to the second amplifier.

31 Claims, 9 Drawing Sheets

Related U.S. Application Data filed on Aug. 22, 2017, provisional application No. 62/548,457, filed on Aug. 22, 2017, provisional application No. 62/548,464, filed on Aug. 22, 2017, provisional application No. 62/548,472, filed on Aug. 22, 2017.

(51) Int. Cl.

| | |
|---|---|
| *H03F 3/195* | (2006.01) |
| *H01P 3/06* | (2006.01) |
| *H01Q 1/50* | (2006.01) |
| *H01Q 21/00* | (2006.01) |
| *H01Q 13/08* | (2006.01) |
| *H04B 7/06* | (2006.01) |
| *H03F 3/19* | (2006.01) |
| *H03F 3/21* | (2006.01) |
| *H04B 1/04* | (2006.01) |
| *H01P 1/22* | (2006.01) |
| *H03H 11/04* | (2006.01) |

(52) U.S. Cl.
CPC ......... *H01Q 13/08* (2013.01); *H01Q 21/0006* (2013.01); *H01Q 21/0025* (2013.01); *H03F 3/19* (2013.01); *H03F 3/195* (2013.01); *H03F 3/211* (2013.01); *H03H 11/04* (2013.01); *H04B 1/0458* (2013.01); *H04B 7/0613* (2013.01); *H03F 2200/315* (2013.01); *H03F 2200/451* (2013.01); *H03H 2011/0488* (2013.01)

(58) Field of Classification Search
CPC . H03F 3/602; H03F 3/604; H03F 3/19; H03F 3/195
See application file for complete search history.

(56) References Cited

U.S. PATENT DOCUMENTS

| | | | |
|---|---|---|---|
| 4,424,496 A | 1/1984 | Nichols et al. | |
| 5,036,335 A | 7/1991 | Jairam | |
| 5,214,394 A * | 5/1993 | Wong ................ | H01Q 13/0258 330/286 |
| 5,256,988 A | 10/1993 | Izadian | |
| 5,736,908 A | 4/1998 | Alexanian et al. | |
| 5,920,240 A | 7/1999 | Alexanian et al. | |
| 6,028,483 A | 2/2000 | Shealy et al. | |
| 6,037,840 A * | 3/2000 | Myer ................ | H01P 5/12 330/295 |
| 6,181,221 B1 | 1/2001 | Kich et al. | |
| 6,828,875 B2 | 12/2004 | Channabasappa et al. | |
| 7,110,165 B2 | 9/2006 | Martin et al. | |
| 7,215,220 B1 | 5/2007 | Jia | |
| 7,466,203 B2 | 12/2008 | Rector | |
| 8,698,577 B2 | 4/2014 | Sherrer et al. | |
| 8,928,429 B2 | 1/2015 | Song et al. | |
| 9,019,036 B2 * | 4/2015 | Kolias ................ | H01P 5/10 330/250 |
| 9,054,427 B2 | 6/2015 | Guy et al. | |
| 9,065,163 B1 | 6/2015 | Wu et al. | |
| 9,276,304 B2 | 3/2016 | Behan et al. | |
| 9,287,605 B2 | 3/2016 | Daughenbaugh, Jr. et al. | |
| 9,325,074 B2 | 4/2016 | Chandler | |
| 9,917,343 B2 | 3/2018 | Chieh et al. | |
| 9,954,706 B1 | 4/2018 | Harris et al. | |
| 10,003,118 B2 | 6/2018 | Kitt | |
| 10,009,067 B2 | 6/2018 | Birk et al. | |
| 10,164,667 B1 | 12/2018 | Kitt | |
| 2006/0202777 A1 | 9/2006 | Deckman et al. | |
| 2007/0229186 A1 | 10/2007 | Hacker et al. | |
| 2007/0279146 A1 | 12/2007 | Rector | |
| 2014/0145794 A1 | 5/2014 | Courtney et al. | |
| 2014/0167880 A1 | 6/2014 | Daughenbaugh, Jr. et al. | |
| 2015/0270817 A1 | 9/2015 | Campbell | |
| 2017/0149113 A1 | 5/2017 | Theveneau et al. | |
| 2017/0179598 A1 | 6/2017 | Kitt | |
| 2018/0294539 A1 | 10/2018 | Kitt | |
| 2019/0007007 A1 | 1/2019 | Kitt | |
| 2019/0067778 A1 | 2/2019 | Mohan | |
| 2019/0067781 A1 | 2/2019 | Mohan et al. | |
| 2019/0067782 A1 | 2/2019 | Mohan et al. | |
| 2019/0067783 A1 | 2/2019 | Mohan et al. | |
| 2019/0067836 A1 | 2/2019 | Mohan | |
| 2019/0068123 A1 | 2/2019 | Mohan et al. | |
| 2019/0068141 A1 | 2/2019 | Yoon et al. | |

OTHER PUBLICATIONS

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 151637,472, dated Mar. 12, 2019, 7 pages.

Non-Final Office Action for U.S. Appl. No. 15/846,840, dated Mar. 21, 2019, 4 pages.

Author Unknown, "Spatial Combining Technology: Revolutionizing the Microwave Power Amplifier," Microwave Journal, Sep. 8, 2008, http://www.microwavejoumal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggier!, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 151290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial

(56) References Cited

OTHER PUBLICATIONS

Inputs," International Journal of Electronics and Communications (AEU), vol. 68, 2014, pp. 422-428.
Tribak, A., et al., "Ultra-Broadband High Efficiency Mode Converter," Progress in Electromagnetics Research C, vol. 36, 2013, pp. 145-158.
Montgomery, R., et al., "Solid-State PAs Bathe TWTAs for ECM Systems," Microwave Journal, Jun. 2017 Supplement, Jun. 14, 2017, 3 pages.
Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 15/933,821, dated Jul. 11, 2019, 7 pages.
Non-Final Office Action for U.S. Appl. No. 15/981,516, dated Jul. 17, 2019, 5 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.

\* cited by examiner

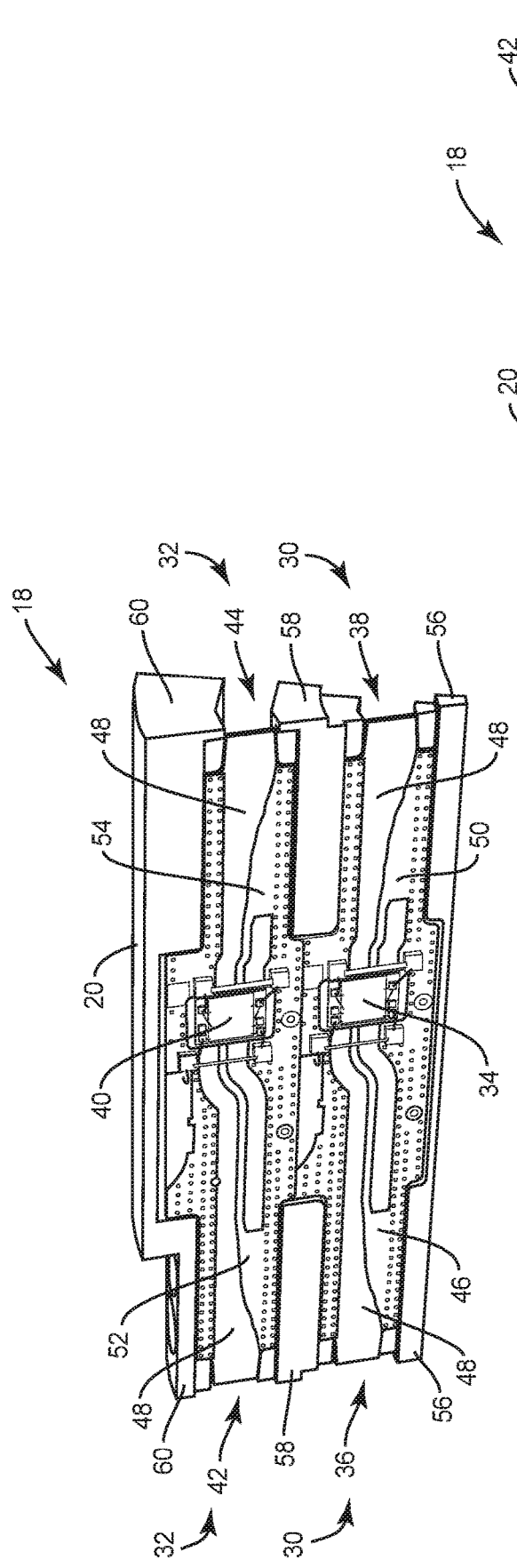
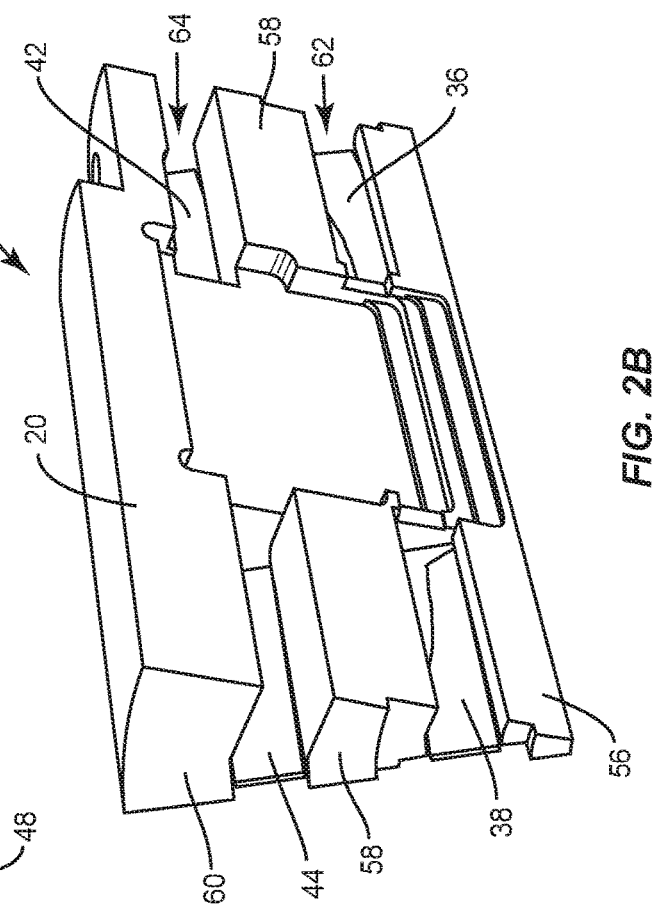

AMPLIFIER ASSEMBLIES WITH MULTIPLE ANTENNA STRUCTURES AND AMPLIFIERS

RELATED APPLICATION

The present application is related to U.S. patent application Ser. No. 15/933,821, filed on Mar. 23, 2018, entitled "SPATIAL POWER-COMBINING DEVICES WITH FILTERING ELEMENTS," and subsequently published as U.S. Patent Application Publication No. 2019/0068140 A1 on Feb. 28, 2019, which is incorporated herein by reference in its entirety.

FIELD OF THE DISCLOSURE

The disclosure relates generally to an amplifier assembly and, more particularly, to an amplifier assembly with multiple antenna structures and amplifiers.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, input antennas may form an input antipodal antenna array, and output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Performance of spatial power-combining devices depends on a number of parameters, including size, spacing, and number of amplifier assemblies in a particular device. For example, the size and spacing of the amplifier assemblies in a coaxial arrangement about a center axis are relatively important for a given operation frequency range and bandwidth of the spatial-power combining device. If the spacing between the amplifier assemblies is too great, the device does not function; and if the spacing between the amplifier assemblies is too close, there may be interference. Additionally, the output power of a spatial-power combining device is proportional to the number of amplifier assemblies in a particular device.

SUMMARY

Aspects disclosed herein include spatial power-combining devices and, in particular, spatial power-combining devices with amplifier assemblies that include multiple antennas. Each of the amplifier assemblies include multiple amplifiers that are coupled to the multiple antennas and in this manner, output power of a spatial power-combining device is increased.

In this regard, in one aspect, a spatial power-combining device for modifying a signal comprises a plurality of amplifier assemblies, wherein each amplifier assembly of the plurality of amplifier assemblies comprises a first amplifier sub-assembly and a second amplifier sub-assembly. The first amplifier sub-assembly comprises a first amplifier, a first input antenna structure coupled to the first amplifier, and a first output antenna structure coupled to the first amplifier. The second amplifier sub-assembly comprises a second amplifier, a second input antenna structure coupled to the second amplifier, and a second output antenna structure coupled to the second amplifier. In further aspects, the spatial power-combining device comprises an input coaxial waveguide section configured to concurrently provide a signal to the first input antenna structure and the second input antenna structure. The input coaxial waveguide section comprises an input waveguide inner conductor, an input waveguide outer conductor, and an input waveguide opening positioned between the input waveguide inner conductor and the input waveguide outer conductor. At least one amplifier assembly of the plurality of amplifier assemblies comprises a body that comprises a first amplifier assembly inner conductor, a second amplifier assembly inner conductor, and an amplifier assembly outer conductor. In further aspects, the second amplifier assembly inner conductor is not in contact with the input waveguide inner conductor and the input waveguide outer conductor.

In another aspect, a spatial power-combining device structure for a spatial power-combining device comprises a first amplifier assembly structure that comprises a wedge-shaped body. The wedge-shaped body comprises a first amplifier assembly inner conductor, a second amplifier assembly inner conductor, and an amplifier assembly outer conductor. The second amplifier assembly inner conductor is at least partially separated from the first amplifier assembly inner conductor and the amplifier assembly outer conductor. In further aspects, the wedge-shaped body comprises a first input opening that at least partially separates the second amplifier assembly inner conductor from the first amplifier assembly inner conductor and a second input opening that at least partially separates the second amplifier assembly inner conductor from the amplifier assembly outer conductor. A first input antenna structure may be coupled to the first amplifier assembly inner conductor and the second amplifier assembly inner conductor across the first input opening and a second input antenna structure may be coupled to the second amplifier assembly inner conductor and the amplifier assembly outer conductor across the second input opening. The spatial power-combining device structure may include additional antenna structures and amplifiers.

In another aspect, a spatial power-combining device for modifying a signal comprises a plurality of amplifier assemblies, wherein each amplifier assembly of the plurality of amplifier assemblies comprises a plurality of amplifiers, and the plurality of amplifiers are configured to concurrently amplify an input signal in parallel with each other. In some aspects, the spatial power-combining device includes an input coaxial waveguide section configured to provide the input signal, and each amplifier assembly is configured to concurrently split the input signal into a plurality of input signal portions that correspond to a separate amplifier. The plurality of amplifiers are configured to concurrently amplify a corresponding input signal portion to generate corresponding amplified output signal portions and concurrently provide the corresponding amplified output signal portions to an output coaxial waveguide section.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 2A is a perspective view of an amplifier assembly according to some embodiments;

FIG. 2B is a backside perspective view of the amplifier assembly of FIG. 2A;

DETAILED DESCRIPTION

Figure 1:
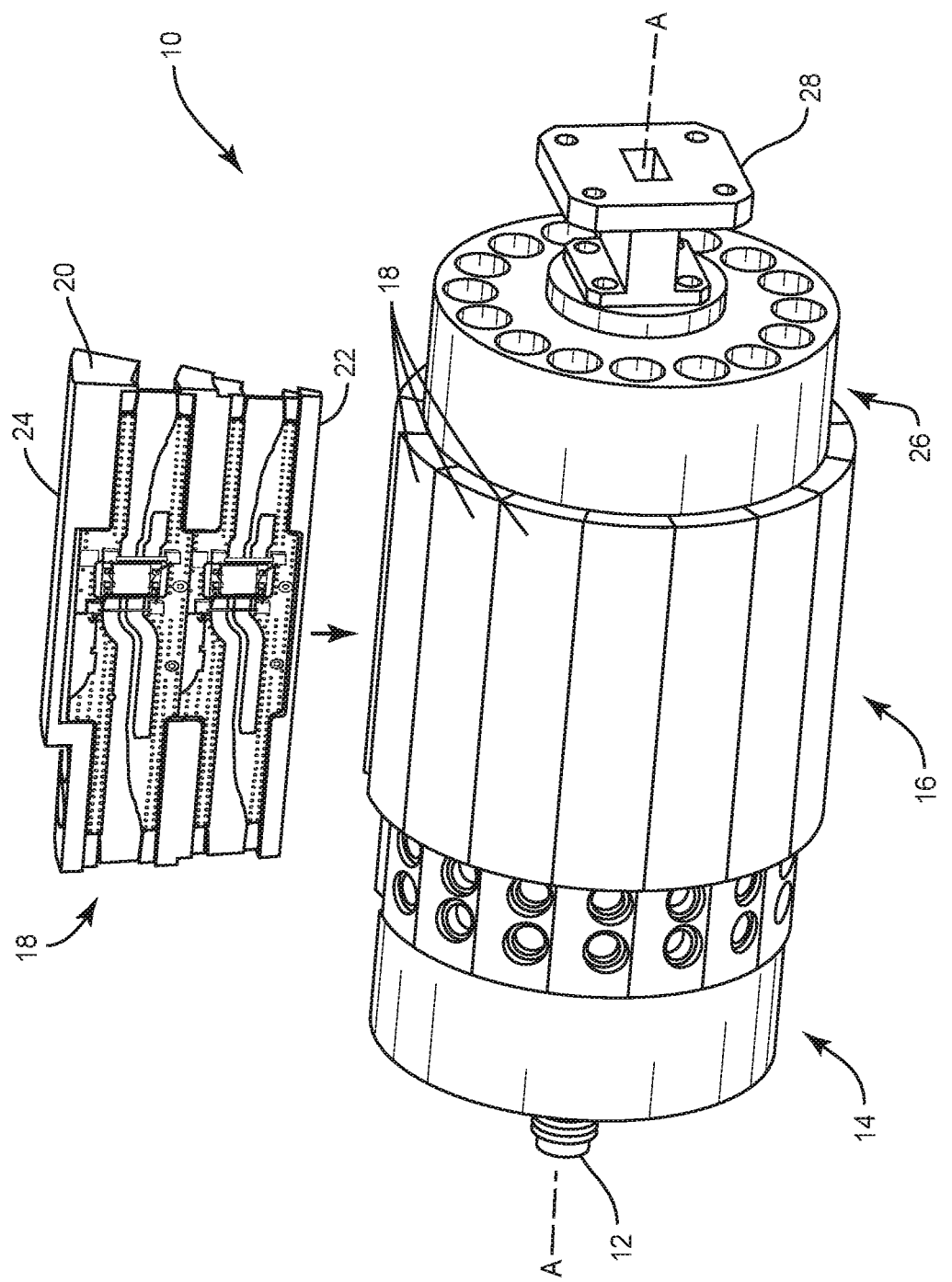
FIG. 1 is a partially-exploded perspective view of a spatial power-combining device according to some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include spatial power-combining devices and, in particular, spatial power-combining devices with amplifier assemblies that include multiple antennas. Each of the amplifier assemblies includes multiple amplifiers that are coupled to the multiple antennas and, in this manner, output power of a spatial power-combining device is increased.

The embodiments are particularly adapted to spatial power-combining devices that operate at microwave frequencies, such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 2 GHz to 20 GHz. In other embodiments, the operating frequency range includes an operating bandwidth spread of 4 GHz to 41 GHz.

A spatial power-combining device generally includes a plurality of amplifier assemblies, and each amplifier assembly includes an amplifier sub-assembly. The amplifier sub-assembly includes an amplifier connected to an input antenna structure and an output antenna structure to provide an individual signal path. An input coaxial waveguide section is configured to provide a signal concurrently to each input antenna structure, and an output coaxial waveguide section is configured to concurrently combine the amplified signals from each output antenna structure. The plurality of amplifier assemblies are arranged coaxially about a center axis. Accordingly, the spatial power-combining device is configured to split, amplify, and combine an electromagnetic signal. The output power of the spatial power-combining device is proportional to a total number of the amplifiers. In that regard, some embodiments disclosed herein are related to a spatial power-combining device that includes a plurality of amplifier assemblies wherein each amplifier assembly includes a plurality of amplifier sub-assemblies. Each amplifier sub-assembly includes an amplifier connected to an input antenna structure and an output antenna structure to provide an individual signal path. Accordingly, each amplifier assembly includes a plurality of amplifiers configured to concurrently amplify an input signal in parallel with each other across a plurality of individual signal paths.

FIG. 1 is a partially-exploded perspective view of a representative spatial power-combining device 10 according to some embodiments. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16.

The center waveguide section 16 comprises a plurality of amplifier assemblies 18 arranged radially around a center axis A of the spatial power-combining device 10. Each amplifier assembly 18 comprises a body 20 having a predetermined wedge-shaped cross-section, an inner surface 22, and an arcuate outer surface 24. When the plurality of amplifier assemblies 18 are collectively assembled radially about the center axis A, they may form the center waveguide section 16 with a generally cylindrical shape; however, other shapes are possible, such as rectangular, oval, or other geometric shapes.

The spatial power-combining device 10 also comprises an output coaxial waveguide section 26 and an output port 28. The input port 12 and the output port 28 may be field-replaceable Subminiature A (SMA) connectors. In other embodiments, the input port 12 and the output port 28 may be super SMA connectors, type N connectors, K connectors, WR28 connectors or other coaxial to waveguide transition connectors, or any other suitable radio frequency (RF) connectors. The input port 12 and the output port 28 may comprise the same type of connector, or they may be different. For example, in FIG. 1, the output port 28 may be a W28 connector, and the input port 12 may be a SMA connector; however, any combination of coaxial RF connectors may be used. The output coaxial waveguide section 26 provides a broadband transition from the center waveguide section 16 to the output port 28. Electrically, the output coaxial waveguide section 26 provides broadband impedance matching from the impedance $Z_c$ of the center waveguide section 16 to an impedance $Z_{p2}$ of the output port 28.

FIG. 2A is a perspective view of an amplifier assembly 18 according to some embodiments. The amplifier assembly 18 comprises a first amplifier sub-assembly 30 and a second amplifier sub-assembly 32. The first amplifier sub-assembly 30 comprises a first amplifier 34, a first input antenna structure 36 coupled to the first amplifier 34, and a first output antenna structure 38 coupled to the first amplifier 34. The second amplifier sub-assembly 32 comprises a second amplifier 40, a second input antenna structure 42 coupled to the second amplifier 40, and a second output antenna structure 44 coupled to the second amplifier 40. In this regard, the first amplifier sub-assembly 30 and the second amplifier sub-assembly 32 are separate signal paths for the first amplifier 34 and the second amplifier 40, respectively. In some embodiments, the first amplifier 34 comprises a first Monolithic Microwave Integrated Circuit (MMIC) amplifier and the second amplifier 40 comprises a second MMIC amplifier.

A MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss. A conventional approach to increase the output power of a spatial power-combing device involves increasing the number of amplifier assemblies; however, this approach is limited by how thin each amplifier assembly can be without sacrificing mechanical integrity. Another approach is to add a second MMIC to the single signal path of an amplifier assembly and add a divider/combiner element or circuit that distributes the incoming signal to each MMIC and receives the signal from each MMIC. However, the divider/combiner element typically introduces adverse frequency limitations to the overall device. Additionally, interference may be present because both MMICs are on the same signal path. As previously described, the amplifier assembly 18 of FIG. 2A includes the first amplifier sub-assembly 30 and the second amplifier sub-assembly 32 that provide separate signal paths for each of the first amplifier 34 and the second amplifier 40, respectively. Accordingly, the output power of a spatial power-combining device may be scaled by adding additional MMICs without comprising mechanical stability or sacrificing device performance. In particular, the output power is proportional to the number of amplifier sub-assemblies and MMICs. For example, a spatial power-combining device with sixteen amplifier assemblies, where each amplifier assembly has two amplifier sub-assemblies with two corresponding MMICs, will have about twice the output power as a spatial power-combining device with sixteen amplifier assemblies, where each amplifier assembly has only one amplifier sub-assembly with one MMIC. In a like manner, a spatial power-combining device where each amplifier assembly has three amplifier sub-assemblies and three corresponding MMICs will have about three times the output power compared to a spatial power-combining device where each amplifier has only one amplifier sub-assembly with one MMIC, and a spatial power-combining device where each amplifier assembly has four amplifier sub-assemblies and four corresponding MMICs will have about four times the output power compared to a spatial power-combining device where each amplifier has only one amplifier sub-assembly with one MMIC.

In FIG. 2A, the first input antenna structure 36 comprises a first input antenna pattern 46 supported on a board 48, and the first output antenna structure 38 comprises a first output antenna pattern 50 supported on the board 48. Additionally, the second input antenna structure 42 comprises a second input antenna pattern 52 supported by the board 48, and the second output antenna structure 44 comprises a second output antenna pattern 54 supported by the board 48. The board 48 may be a printed circuit board that provides a desired form factor and mechanical support. It is understood that each of the first input antenna pattern 46, the first output antenna pattern 50, the second input antenna pattern 52, and the second output antenna pattern 54 may include signal conductors and ground conductors on opposing sides of the board 48. In other embodiments, the board 48 may be substituted with a plurality of boards. In still other embodiments, the first input antenna pattern 46, the first output antenna pattern 50, the second input antenna pattern 52, and the second output antenna pattern 54 may comprise metal that is thick enough to be incorporated into each amplifier assembly 18 without requiring the board 48.

The body 20 of the amplifier assembly 18 comprises a first amplifier assembly inner conductor 56, a second amplifier assembly inner conductor 58, and an amplifier assembly outer conductor 60. The second amplifier assembly inner conductor 58 is positioned between the first input antenna structure 36 and the second input antenna structure 42. The second amplifier assembly inner conductor 58 is additionally positioned between the first output antenna structure 38 and the second output antenna structure 44. FIG. 2B is a backside perspective view of the amplifier assembly 18 of FIG. 2A. In FIG. 2B, the first amplifier assembly inner conductor 56, the second amplifier assembly inner conductor 58, and the amplifier assembly outer conductor 60 are an integral single component with the body 20. In some aspects, the body 20 is wedge-shaped to accommodate radial assembly with other amplifier assemblies 18. As illustrated, the second amplifier assembly inner conductor 58 is at least partially separated from the first amplifier assembly inner conductor 56 and the amplifier assembly outer conductor 60. For example, a first input opening 62 at least partially separates the second amplifier assembly inner conductor 58 from the first amplifier assembly inner conductor 56, and a second input opening 64 at least partially separates the second amplifier assembly inner conductor 58 from the amplifier assembly outer conductor 60. The first input antenna structure 36, shown from the backside in FIG. 2B, is coupled to the first amplifier assembly inner conductor 56 and the second amplifier assembly inner conductor 58 across the first input opening 62. Additionally, the second input antenna structure 42 is coupled to the second amplifier assembly inner conductor 58 and the amplifier assembly outer conductor 60 across the second input opening 64. In a similar manner, the first output antenna structure 38 is coupled to the first amplifier assembly inner conductor 56 and the second amplifier assembly inner conductor 58 across the first input opening 62 and the second output antenna structure 44 is coupled to the second amplifier assembly inner conductor 58 and the amplifier assembly outer conductor 60 across the second input opening 64.

Accordingly, some embodiments include a spatial power-combining device structure that comprises a first amplifier assembly structure comprising a wedge-shaped body. The wedge-shaped body comprises a first amplifier assembly inner conductor, a second amplifier assembly inner conductor, and an amplifier assembly outer conductor. The second amplifier assembly inner conductor is at least partially separated from the first amplifier assembly inner conductor and the amplifier assembly outer conductor.

Figure 3:
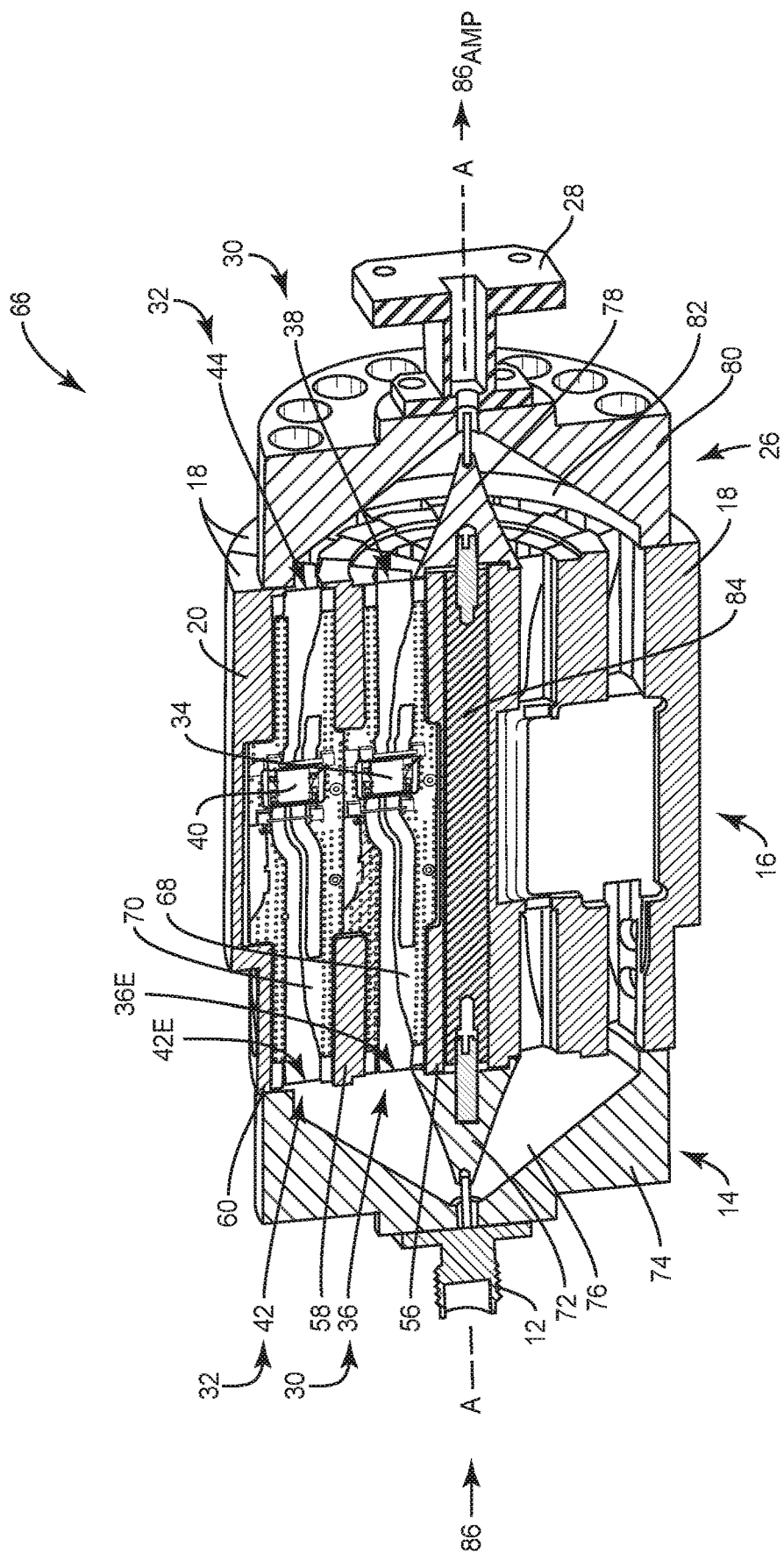
FIG. 3 is a partial cross-sectional view of a spatial power-combining device according to some embodiments.

FIG. 3 is a partial cross-sectional view of a spatial power-combining device 66 according to some embodiments. Several amplifier assemblies 18 are omitted to illustrate the following details. The spatial power-combining device 66 includes the input port 12, the input coaxial waveguide section 14, the center waveguide section 16, the output coaxial waveguide section 26, and the output port 28 as previously described. The center waveguide section 16 includes the plurality of amplifier assemblies 18 arranged radially around the center axis A of the spatial power-combining device 66. As also described above, each amplifier assembly 18 comprises the first amplifier sub-assembly 30 and the second amplifier sub-assembly 32. The first amplifier sub-assembly 30 comprises the first amplifier 34, the first input antenna structure 36 coupled to the first amplifier 34, and the first output antenna structure 38 coupled to the first amplifier 34. The second amplifier sub-assembly 32 comprises the second amplifier 40, the second input antenna structure 42 coupled to the second amplifier 40, and the second output antenna structure 44 coupled to the second amplifier 40. In this regard, the first amplifier sub-assembly 30 and the second amplifier sub-assembly 32 are separate signal paths for the first amplifier 34 and the second amplifier 40, respectively. The first amplifier sub-assembly 30 and the second amplifier sub-assembly 32 are positioned radially with respect to the center axis A and the first amplifier sub-assembly 30 is positioned closer to the center axis A than the second amplifier sub-assembly 32.

The first input antenna structure 36 further comprises a first input signal conductor 68 extending from an end 36E of the first input antenna structure 36 adjacent the input coaxial waveguide section 14 to the first amplifier 34. The second input antenna structure 42 further comprises a second input signal conductor 70 extending from an end 42E of the second input antenna structure 42 adjacent the input coaxial waveguide section 14 to the second amplifier 40. Notably, the first input signal conductor 68 extends a same distance as the second input signal conductor 70. Accordingly, a signal that is concurrently provided to both the first input end 36E and the second input end 42E may travel the same distance to reach the first amplifier 34 and the second amplifier 40, respectively.

The input coaxial waveguide section 14 is configured to concurrently provide a signal to the first input antenna structure 36 and the second input antenna structure 42 of each amplifier assembly 18 of the plurality of amplifier assemblies 18. The input coaxial waveguide section 14 comprises an input waveguide inner conductor 72 and an input waveguide outer conductor 74. Outer surfaces of the input waveguide inner conductor 72 and inner surfaces of the input waveguide outer conductor 74 have gradually changed profiles configured to minimize an impedance mismatch from the input port 12 to the center waveguide section 16. An input waveguide opening 76 is positioned between the input waveguide inner conductor 72 and the input waveguide outer conductor 74. Each amplifier assembly 18 includes the body 20 comprising the first amplifier assembly inner conductor 56, the second amplifier assembly inner conductor 58, and the amplifier assembly outer conductor 60. The second amplifier assembly inner conductor 58 is positioned between the first input antenna structure 36 and the second input antenna structure 42. Notably, the amplifier assembly outer conductor 60 is in contact with the input waveguide outer conductor 74 and the first amplifier assembly inner conductor 56 is in contact with the input waveguide inner conductor 72. The second amplifier assembly inner conductor 58 is neither in contact with the input waveguide inner conductor 72 nor the input waveguide outer conductor 74. Accordingly, the first input antenna structure 36 and the second input antenna structure 42 are both configured to concurrently receive a signal propagating in the input waveguide opening 76 of the input coaxial waveguide section 14.

The output coaxial waveguide section 26 is configured in a similar manner to the input coaxial waveguide section 14, except the output coaxial waveguide section 26 is configured to concurrently combine signals transmitted from the first output antenna structure 38 and the second output antenna structure 44 of each amplifier assembly 18 of the plurality of amplifier assemblies 18 to form a combined output signal. The output coaxial waveguide section 26 comprises an output waveguide inner conductor 78 and an output waveguide outer conductor 80. Outer surfaces of the output waveguide inner conductor 78 and inner surfaces of the output waveguide outer conductor 80 have gradually changed profiles configured to minimize an impedance mismatch from the center waveguide section 16 to the output port 28. An output waveguide opening 82 is positioned between the output waveguide inner conductor 78 and the output waveguide outer conductor 80. The second amplifier assembly inner conductor 58 is positioned between the first output antenna structure 38 and the second output antenna structure 44. Notably, the amplifier assembly outer conductor 60 is in contact with the output waveguide outer conductor 80 and the first amplifier assembly inner conductor 56 is in contact with the output waveguide inner conductor 78. The second amplifier assembly inner conductor 58 is neither in contact with the output waveguide inner conductor 78 nor the output waveguide outer conductor 80. Accordingly, the first output antenna structure 38 and the second output antenna structure 44 are both configured to concurrently provide an amplified signal to the output coaxial waveguide section 26 via the output waveguide opening 82.

As also illustrated in FIG. 3, the center waveguide section 16 comprises the plurality of amplifier assemblies 18 positioned circumferentially around a post 84. The body 20 of each amplifier assembly 18 comprises a predetermined wedge-shaped cross-section and when the amplifier assemblies 18 are assembled together, they form a cylinder with a cylindrical central cavity, which accommodates the post 84. The input waveguide inner conductor 72 and the output waveguide inner conductor 78 may be directly attached to the post 84. The post 84 may also be referred to as a center rod. In other embodiments, such as ones where it is desired to position the amplifier assemblies 18 closer together around the center axis A, the post 84 may be omitted. In such embodiments, the input waveguide inner conductor 72 and the output waveguide inner conductor 78 may be directly attached to the first amplifier assembly inner conductor 56 of each amplifier assembly 18.

In operation, an input signal 86 enters through the input port 12 and propagates through the input coaxial waveguide section 14 to the first input antenna structure 36 and the second input antenna structure 42 of each amplifier assembly 18. Each first input antenna structure 36 and second input antenna structure 42 couples the input signal 86 concurrently to each first amplifier 34 and second amplifier 40, respectively. Each first output antenna structure 38 and second output antenna structure 44 couples a portion of an amplified signal $86_{AMP}$ to the output coaxial waveguide section 26 to be propagated through the output port 28 as the amplified signal $86_{AMP}$.

Accordingly, some embodiments disclosed herein include a spatial power-combining device comprising a plurality of amplifier assemblies, wherein each amplifier assembly of the plurality of amplifier assemblies comprises a plurality of amplifiers. The plurality of amplifiers are configured to concurrently amplify an input signal in parallel with each other. Additionally, an input coaxial waveguide section is configured to provide the input signal and each amplifier assembly of the plurality of amplifier assemblies is configured to concurrently split the input signal received from the input coaxial waveguide into a plurality of input signal portions. Each input signal portion of the plurality of input signal portions corresponds to a separate amplifier of the plurality of amplifiers. Each amplifier of the plurality of amplifiers is configured to concurrently amplify a corresponding input signal portion to generate corresponding amplified output signal portions, and concurrently provide the corresponding amplified output signal portions to an output coaxial waveguide section.

Figure 4:
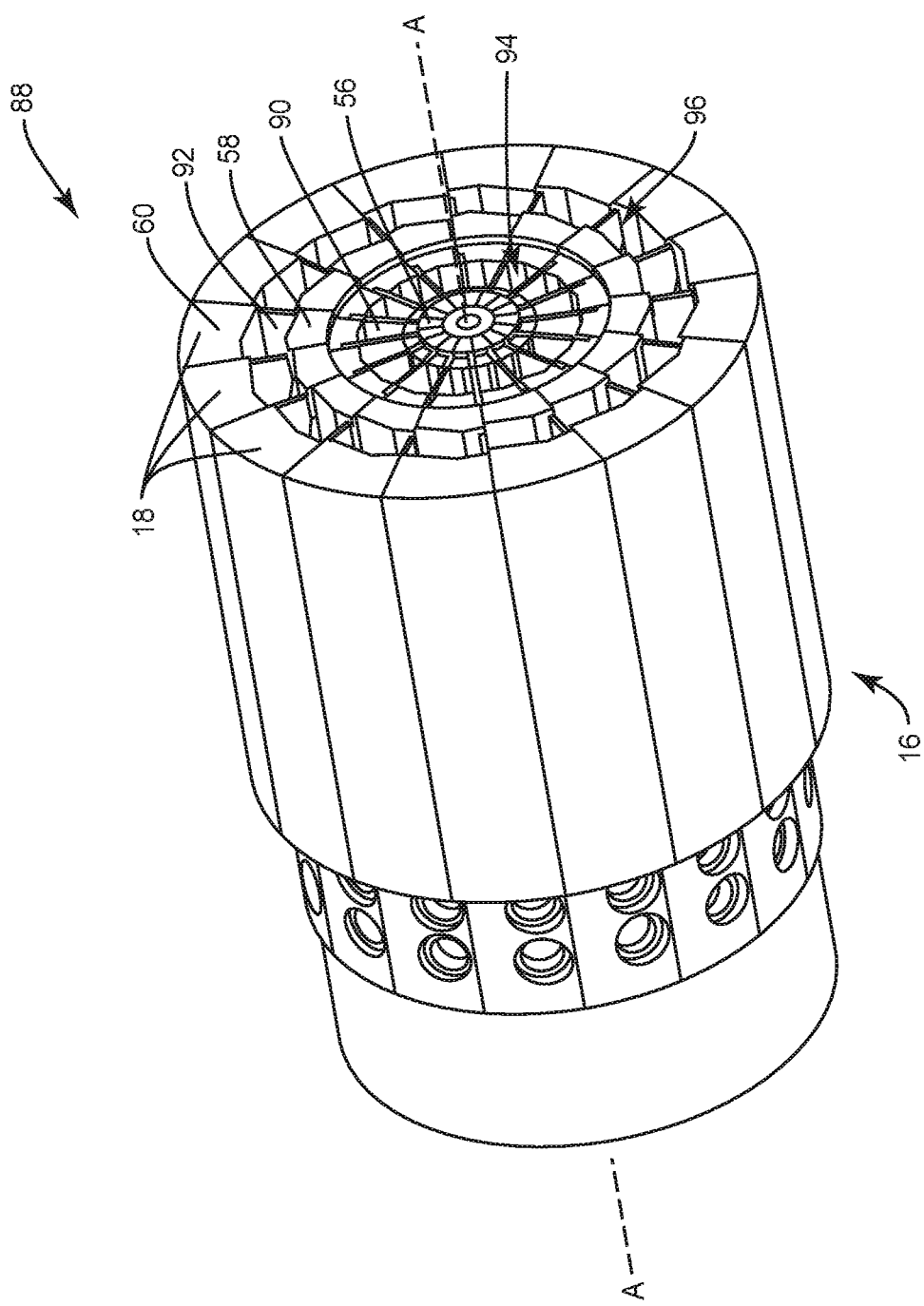
FIG. 4 is a perspective view of a portion of a spatial power-combining device according to some embodiments.

FIG. 4 is a perspective view of a portion of a spatial power-combining device structure 88 similar to the embodiments described in the previous figures but with only the center waveguide section 16 illustrated. The spatial power-combining device structure 88 comprises the plurality of amplifier assemblies 18 arranged coaxially about the center axis A and each amplifier assembly 18 includes the first amplifier assembly inner conductor 56, the second amplifier assembly inner conductor 58, and the amplifier assembly outer conductor 60. As with the first input opening 62 and the second input opening 64 described in FIG. 2B, each amplifier assembly 18 additionally includes a first output opening 90 and a second output opening 92. The first input opening (62 as described for FIG. 2B) and the first output opening 90 of each amplifier assembly 18 collectively form a first cylindrical opening 94. The second input opening (64 as described for FIG. 2B) and the second output opening 92 of each amplifier assembly 18 collectively form a second cylindrical opening 96. The second cylindrical opening 96 is positioned farther away from the center axis A than the first cylindrical opening 94. The first amplifier sub-assembly (30 in FIG. 2A) of each amplifier assembly 18 is positioned in the first cylindrical opening 94 and the second amplifier sub-assembly (32 in FIG. 2A) of each amplifier assembly 18 is positioned in the second cylindrical opening 96. Accordingly, the input coaxial waveguide section (14 in FIG. 3) is configured to concurrently provide an input signal (86 in FIG. 3) to the first amplifier sub-assembly (30 in FIG. 2A) via the first cylindrical opening 94 and the second amplifier sub-assembly (32 in FIG. 2A) via the second cylindrical opening 96 of each amplifier assembly 18. In a like manner, the output coaxial waveguide section (26 in FIG. 3) is configured to concurrently combine amplified signals ($86_{AMP}$ in FIG. 3) from the first amplifier sub-assembly (30 in FIG. 2A) via the first cylindrical opening 94 and the second amplifier sub-assembly (32 in FIG. 2A) via the second cylindrical opening 96 of each amplifier assembly 18.

Figure 5:
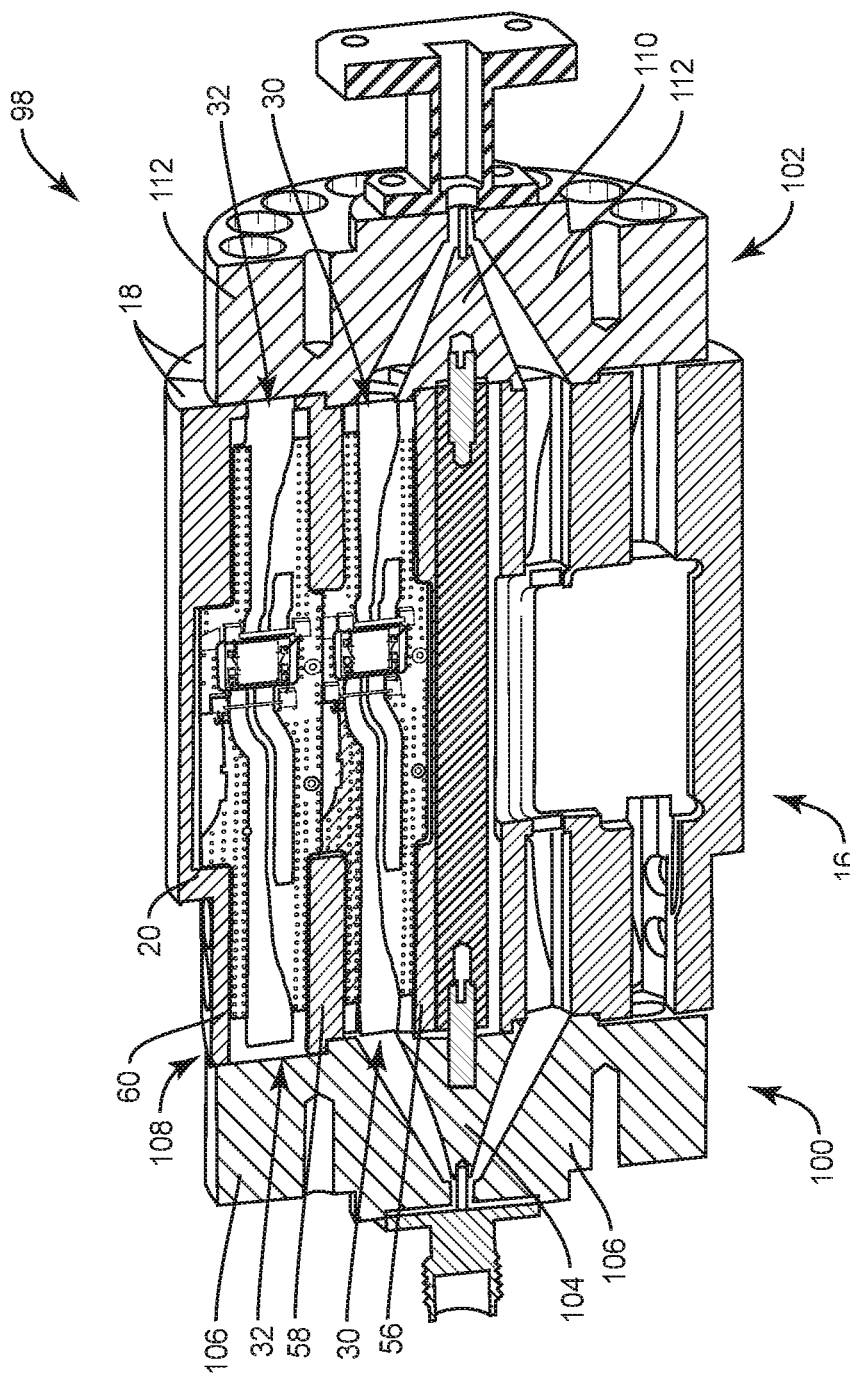
FIG. 5 is a partial cross-sectional view of a spatial power-combining device according to some embodiments.

In other embodiments, it may be desirable to only provide a signal for amplification to a particular amplifier sub-assembly of each amplifier assembly. FIG. 5 is a partial cross-sectional view of a spatial power-combining device 98 that is similar to the spatial power-combining device 66 of FIG. 3. The center waveguide section 16, including the plurality of amplifier assemblies 18, is the same as described for FIG. 3. Each amplifier assembly 18 includes the first amplifier sub-assembly 30; the second amplifier sub-assembly 32; and the body 20 comprising the first amplifier assembly inner conductor 56, the second amplifier assembly inner conductor 58, and the amplifier assembly outer conductor 60, as previously described. The spatial power-combining device 98 further includes an input coaxial waveguide section 100 configured to only provide a signal to the first amplifier sub-assembly 30 of each amplifier assembly 18 and an output coaxial waveguide section 102 configured to only receive a signal from the first amplifier sub-assembly 30 of each amplifier assembly 18. The input coaxial waveguide section 100 includes an input waveguide inner conductor 104 and an input waveguide outer conductor 106. The input waveguide inner conductor 104 is in contact with the first amplifier assembly inner conductor 56 of each amplifier assembly 18 and the input waveguide outer conductor 106 is in contact with the second amplifier assembly inner conductor 58 of each amplifier assembly 18. Notably, the amplifier assembly outer conductor 60 of each amplifier assembly 18 is not in contact with the input coaxial waveguide section 100. For example, the amplifier assembly outer conductor 60 of each amplifier assembly 18 may be separated from the input waveguide outer conductor 106 by a gap 108. Accordingly, a signal from the input coaxial waveguide section 100 will only be provided to the first amplifier sub-assembly 30 of each amplifier assembly 18. The output coaxial waveguide section 102 is provided in a similar configuration wherein an output waveguide inner conductor 110 contacts the first amplifier assembly inner conductor 56 of each amplifier assembly 18 and an output waveguide outer conductor 112 contacts the second amplifier assembly inner conductor 58 of each amplifier assembly 18. Accordingly, the amplifier assembly outer conductor 60 is not in direct contact with the output coaxial waveguide section 102.

In this regard, a spatial power-combining device with a center waveguide section as described herein may be configured with different amplifications based on a configuration of an input coaxial waveguide section and an output coaxial waveguide section. As described above, the different amplifications are based on where the input coaxial waveguide section and the output coaxial waveguide section contact portions of each amplifier assembly in the center waveguide section. Accordingly, a center waveguide section for a spatial power-combining device comprises a center axis and a plurality of amplifier assemblies arranged coaxially about the center axis. The center waveguide section is configured to be an N-way amplifier. In a first configuration, N is equal to x. In a second configuration, N is equal to y, and y is not equal to x. Further examples include configurations where y is equal to two times x, y is equal to three times x, y is equal to four times x, and so on.

In some embodiments, a spatial power-combining device for modifying a signal comprises a center waveguide section comprising a plurality of amplifier assemblies. Each amplifier assembly of the plurality of amplifier assemblies comprises a first amplifier sub-assembly and a second amplifier sub-assembly. The spatial power-combining device is configured to be an N-way combiner. In a first configuration, N is equal to x. In a second configuration, N is equal to y, and y is not equal to x. Further examples include configurations where y is equal to two times x, y is equal to three times x, y is equal to four times x, and so on. In one embodiment, the spatial power-combining device comprises an input coaxial waveguide section configured to concurrently provide a signal to the first amplifier sub-assembly of each amplifier assembly. In another embodiment, the spatial power-combining device comprises an input coaxial waveguide section configured to concurrently provide a signal to the first amplifier sub-assembly and the second amplifier sub-assembly of each amplifier assembly.

The embodiments disclosed herein have been described for amplifier assemblies with at least two amplifier sub-assemblies. However, the configuration of amplifier sub-assemblies allows for scalability and any of the previous embodiments may comprise more than two amplifier sub-assemblies per amplifier assembly. As described, each amplifier sub-assembly includes an amplifier connected to an input antenna structure and an output antenna structure to provide an individual signal path. By providing the individual signal paths, each amplifier sub-assembly can be operated without interference between amplifiers from different sub-assemblies. Accordingly, additional sub-assemblies can be added to each amplifier assembly and output power of a spatial power-combining device will scale with the number of additional sub-assemblies.

Figure 6A:
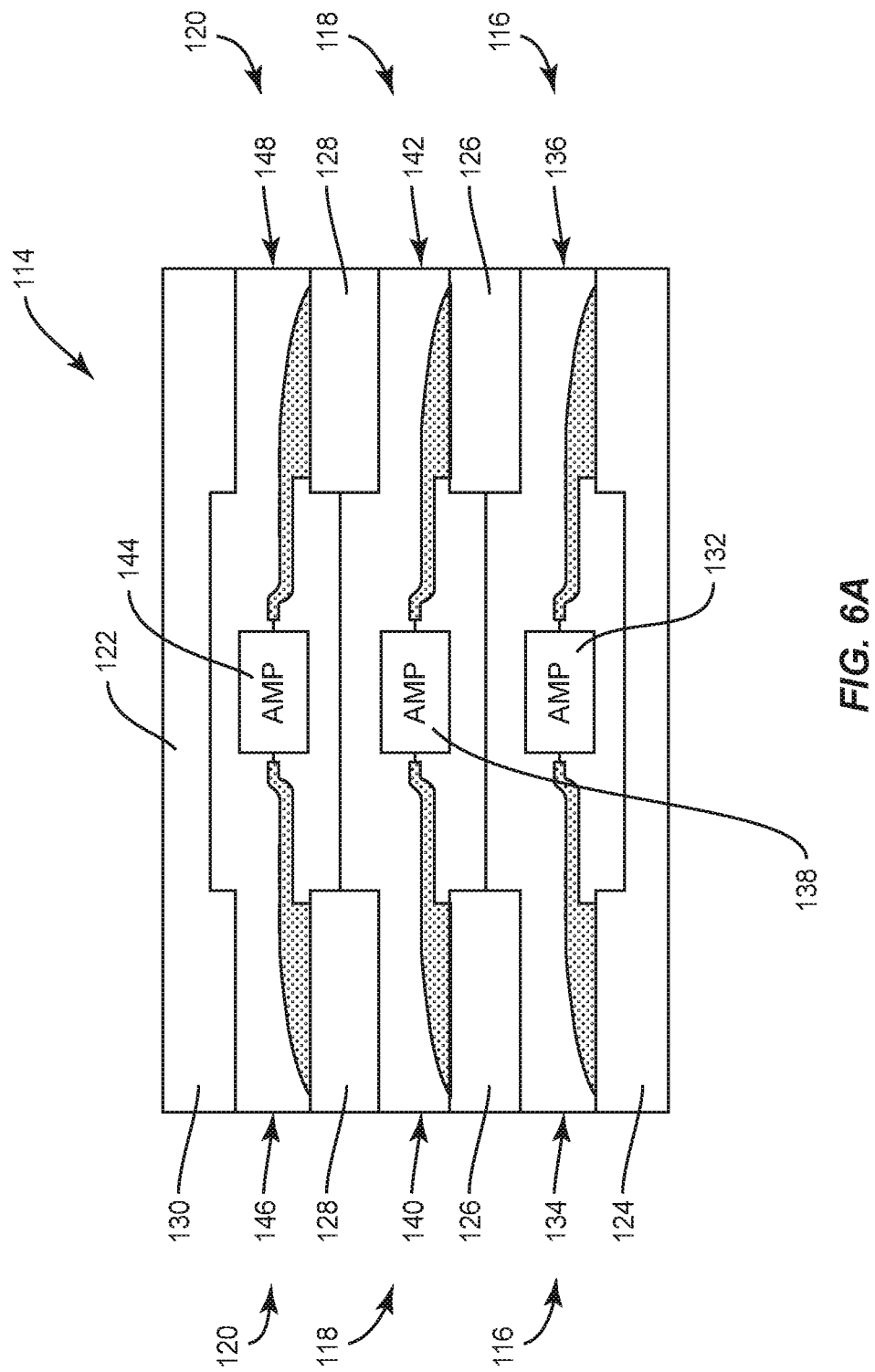
FIG. 6A is an elevation view of an amplifier assembly according to some embodiments.

In that regard, FIG. 6A is an elevation view of a representative amplifier assembly 114 that includes a first amplifier sub-assembly 116, a second amplifier sub-assembly 118, and a third amplifier sub-assembly 120. The amplifier assembly 114 comprises a body 122 comprising a first amplifier assembly inner conductor 124, a second amplifier assembly inner conductor 126, a third amplifier assembly inner conductor 128, and an amplifier assembly outer conductor 130. The first amplifier sub-assembly 116 includes a first amplifier 132, a first input antenna structure 134 coupled to the first amplifier 132, and a first output antenna structure 136 coupled to the first amplifier 132. The second amplifier sub-assembly 118 includes a second amplifier 138, a second input antenna structure 140 coupled to the second amplifier 138, and a second output antenna structure 142 coupled to the second amplifier 138. The third amplifier sub-assembly 120 includes a third amplifier 144, a third input antenna structure 146 coupled to the third amplifier 144, and a third output antenna structure 148 coupled to the third amplifier 144. The third amplifier assembly inner conductor 128 is positioned between the second input antenna structure 140 and the third input antenna structure 146. Accordingly, the amplifier assembly 114 may be utilized in a spatial power-combining device, such as the spatial power-combining device 66 of FIG. 3, and is configured to provide a separate signal path for each of the first amplifier 132, the second amplifier 138, and the third amplifier 144. In that manner, the first amplifier 132, the second amplifier 138, and the third amplifier 144 are configured to concurrently amplify a signal in parallel with each other.

Figure 6B:
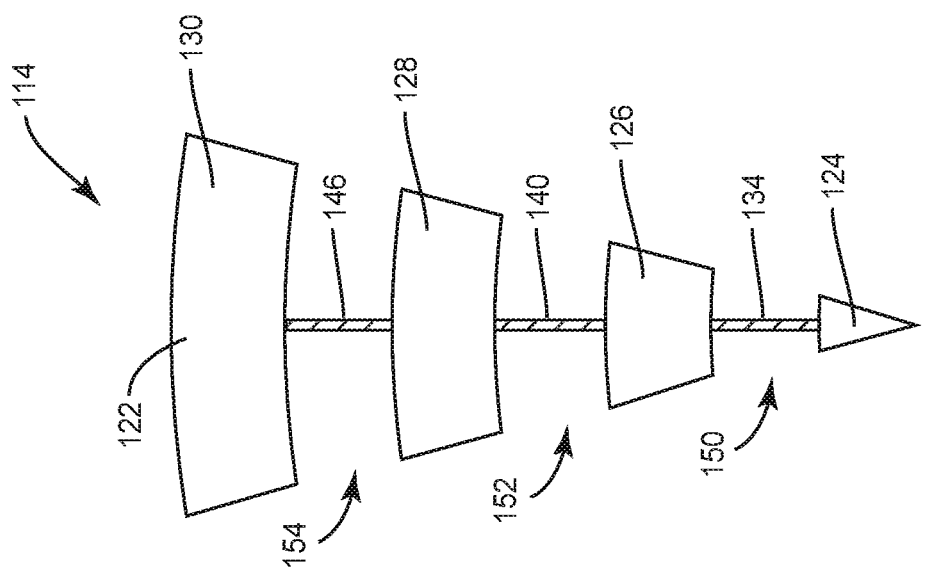
FIG. 6B is a diagram of an end view of the amplifier assembly of FIG. 6A.

FIG. 6B is a diagram of an end view of the amplifier assembly 114 of FIG. 6A. The body 122, including the first amplifier assembly inner conductor 124, the second amplifier assembly inner conductor 126, the third amplifier assembly inner conductor 128, and the amplifier assembly outer conductor 130, is wedge-shaped as previously described. A first input opening 150 at least partially separates the first amplifier assembly inner conductor 124 from the second amplifier assembly inner conductor 126. A second input opening 152 at least partially separates the second amplifier assembly inner conductor 126 from the third amplifier assembly inner conductor 128. A third input opening 154 at least partially separates the third amplifier assembly inner conductor 128 from the amplifier assembly outer conductor 130. The first input antenna structure 134 is coupled to the first amplifier assembly inner conductor 124 and the second amplifier assembly inner conductor 126 across the first input opening 150. The second input antenna structure 140 is coupled to the second amplifier assembly inner conductor 126 and the third amplifier assembly inner conductor 128 across the second input opening 152. The third input antenna structure 146 is coupled to the third amplifier assembly inner conductor 128 and the amplifier assembly outer conductor 130 across the third input opening 154. It is understood the output of the amplifier assembly 114 would be similar to the description above for the input of the amplifier assembly 114 and, accordingly, the term "input" may be replaced with the term "output." As described for FIG. 3 and FIG. 5, an input coaxial waveguide section may be configured to contact the first amplifier assembly inner conductor 124 and the amplifier assembly outer conductor 130 and will thus concurrently provide a signal to the first input antenna structure 134, the second input antenna structure 140, and the third input antenna structure 146. However, alternative configurations are possible. For example, a different input coaxial waveguide section may be configured to contact the first amplifier assembly inner conductor 124 and the third amplifier assembly inner conductor 128 and will then concurrently provide a signal only to the first input antenna structure 134 and the second input antenna structure 140. Different configurations of the input coaxial waveguide section may contact any pair of the first amplifier assembly inner conductor 124, the second amplifier assembly inner conductor 126, the third amplifier assembly inner conductor 128, and the amplifier assembly outer conductor 130 to amplify a signal concurrently along one, two, or three signal paths, where each path includes a separate amplifier. Accordingly, different input coaxial waveguide sections can be coupled to a center waveguide section formed from a plurality of the amplifier assemblies 114 to offer different amplification factors.

Figure 7:
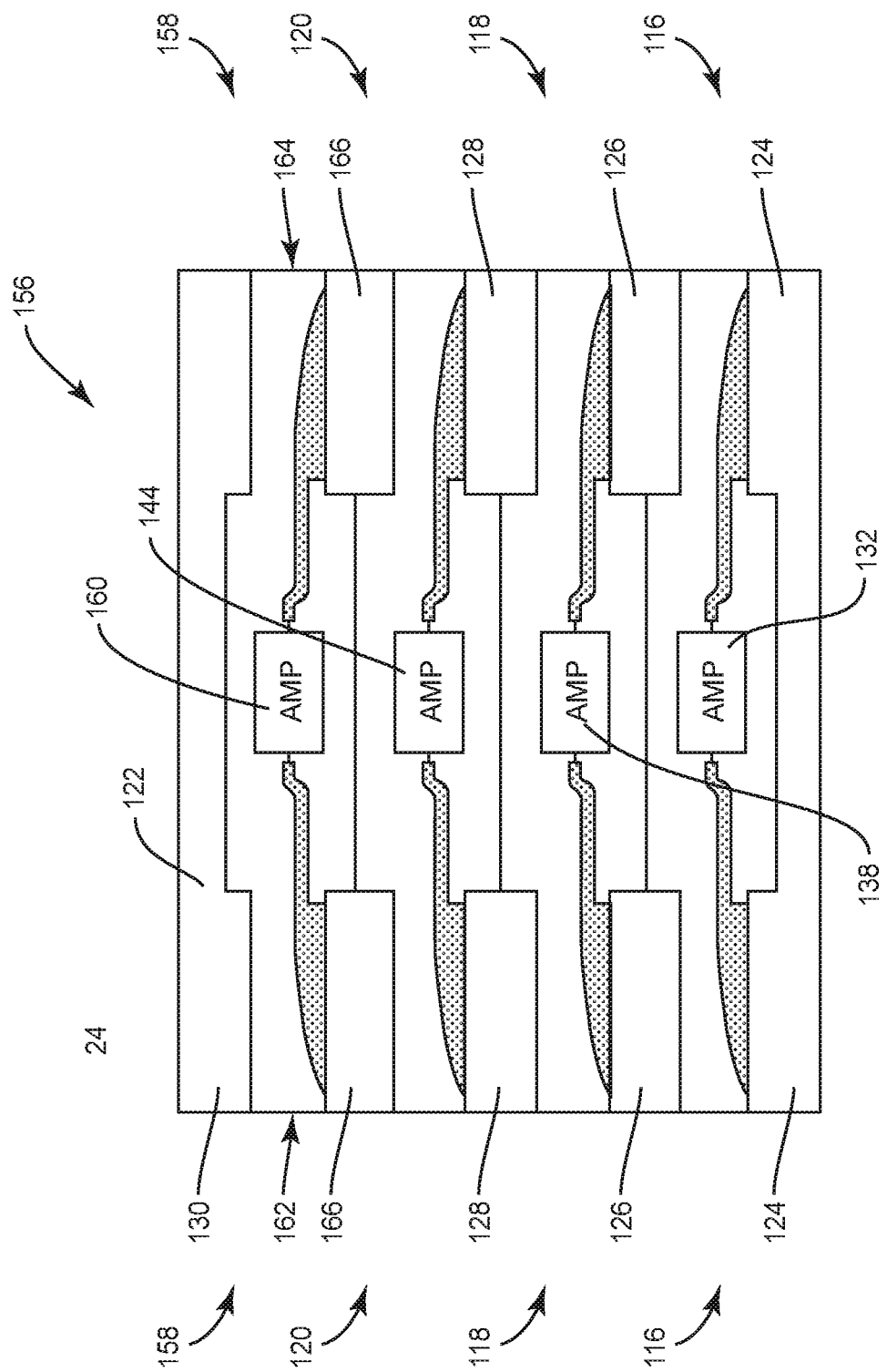
FIG. 7 is an elevation view of an amplifier assembly according to some embodiments.

FIG. 7 is an elevation view of a representative amplifier assembly 156 that is similar to the amplifier assembly 114 of FIG. 6A, but includes a fourth amplifier sub-assembly 158 in addition to the first amplifier sub-assembly 116, the second amplifier sub-assembly 118, and the third amplifier sub-assembly 120 as previously described. The fourth amplifier sub-assembly 158 includes a fourth amplifier 160, a fourth input antenna structure 162 coupled to the fourth amplifier 160, and a fourth output antenna structure 164 coupled to the fourth amplifier 160. The amplifier assembly 156 also includes a fourth amplifier assembly inner conductor 166 in addition to the first amplifier assembly inner conductor 124, the second amplifier assembly inner conductor 126, the third amplifier assembly inner conductor 128, and the amplifier assembly outer conductor 130. Accordingly, the amplifier assembly 156 may be utilized in a spatial power-combining device, such as the spatial power-combining device 66 of FIG. 3, and is configured to provide a separate signal path for each of the first amplifier 132, the second amplifier 138, the third amplifier 144, and the fourth amplifier 160. In that manner, the first amplifier 132, the second amplifier 138, the third amplifier 144, and the fourth amplifier 160 are configured to concurrently amplify a signal in parallel with each other. In other embodiments, different input coaxial waveguide sections can be coupled to a center waveguide section formed from a plurality of the amplifier assemblies 156 to offer different amplification factors as described above.

The embodiments disclosed herein have been described for amplifier assemblies with at least two amplifier sub-assemblies. As previously described, the amplifier assemblies may include a body with a plurality of conductors, such as at least two inner conductors and an outer conductor, at least partially separated by input or output openings. At least a portion of an amplifier sub-assembly is coupled between two conductors across one of the openings. For example, a first input antenna structure of a first amplifier sub-assembly may be coupled to a first amplifier assembly inner conductor and a second amplifier assembly inner conductor across a first input opening. However, the configuration of the body of the amplifier assembly allows more than one amplifier sub-assembly to couple between two conductors across a same opening and any of the previous embodiments may comprise a plurality of amplifier sub-assemblies per opening in the body.

Figure 8:
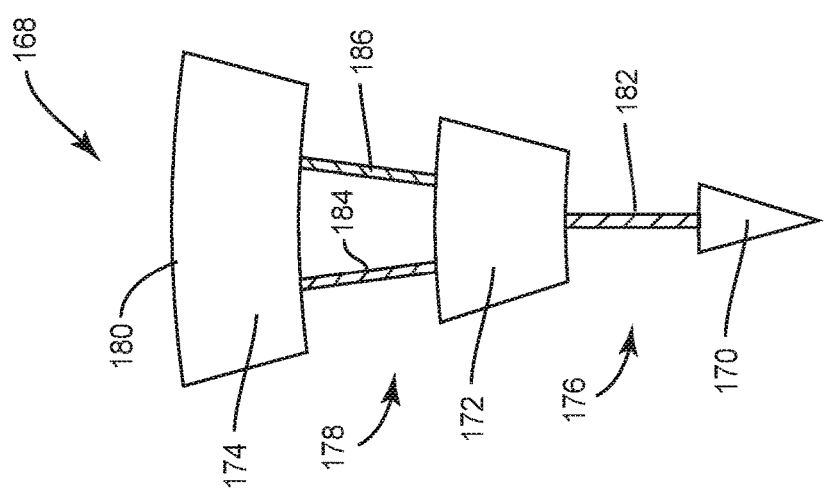
FIG. 8 is a diagram of an end view of an amplifier assembly according to some embodiments.

In that regard, FIG. 8 is a diagram of an end view of an amplifier assembly 168 according to some embodiments. The end view is from an input of the amplifier assembly 168 similar to the end view of the amplifier assembly 114 of FIG. 6B. The amplifier assembly 168 includes a first amplifier assembly inner conductor 170, a second amplifier assembly inner conductor 172, and an amplifier assembly outer conductor 174. A first input opening 176 at least partially separates the first amplifier assembly inner conductor 170 from the second amplifier assembly inner conductor 172. A second input opening 178 at least partially separates the second amplifier assembly inner conductor 172 from the amplifier assembly outer conductor 174. A body 180 of the amplifier assembly 168 generally has a wedge shape and, accordingly, the second input opening 178 is larger in area than the first input opening 176. A first input antenna structure 182 is coupled to the first amplifier assembly inner conductor 170 and the second amplifier assembly inner conductor 172 across the first input opening 176. A second input antenna structure 184 and a third input antenna structure 186 are coupled to the second amplifier assembly inner conductor 172 and the amplifier assembly outer conductor 174 across the second input opening 178.

Accordingly, the amplifier assembly 168 is provided where at least one opening (the second input opening 178 in FIG. 8) in the body 180 accommodates a plurality of input antenna structures (the second input antenna structure 184 and the third input antenna structure 186 in FIG. 8). It is understood an output of the amplifier assembly 168 would be similar to the description above for the input of the amplifier assembly 168 and, accordingly, the term "input" may be replaced with the term "output." As previously described, an input coaxial waveguide section may be configured to contact the first amplifier assembly inner conductor 170 and the amplifier assembly outer conductor 174 and will thus concurrently provide a signal to the first input antenna structure 182, the second input antenna structure 184, and the third input antenna structure 186. However, alternative configurations are possible. For example, a different input coaxial waveguide section may be configured to contact the second amplifier assembly inner conductor 172 and the amplifier assembly outer conductor 174 and will then concurrently provide a signal only to the second input antenna structure 184 and the third input antenna structure 186. Different configurations of the input coaxial waveguide section may contact any pair of the first amplifier assembly inner conductor 170, the second amplifier assembly inner conductor 172, and the amplifier assembly outer conductor 174 to amplify a signal concurrently along one, two, or three signal paths. Accordingly, different input coaxial waveguide sections can be coupled to a center waveguide section formed from a plurality of the amplifier assemblies 168 to offer different amplification factors.

Figure 9:
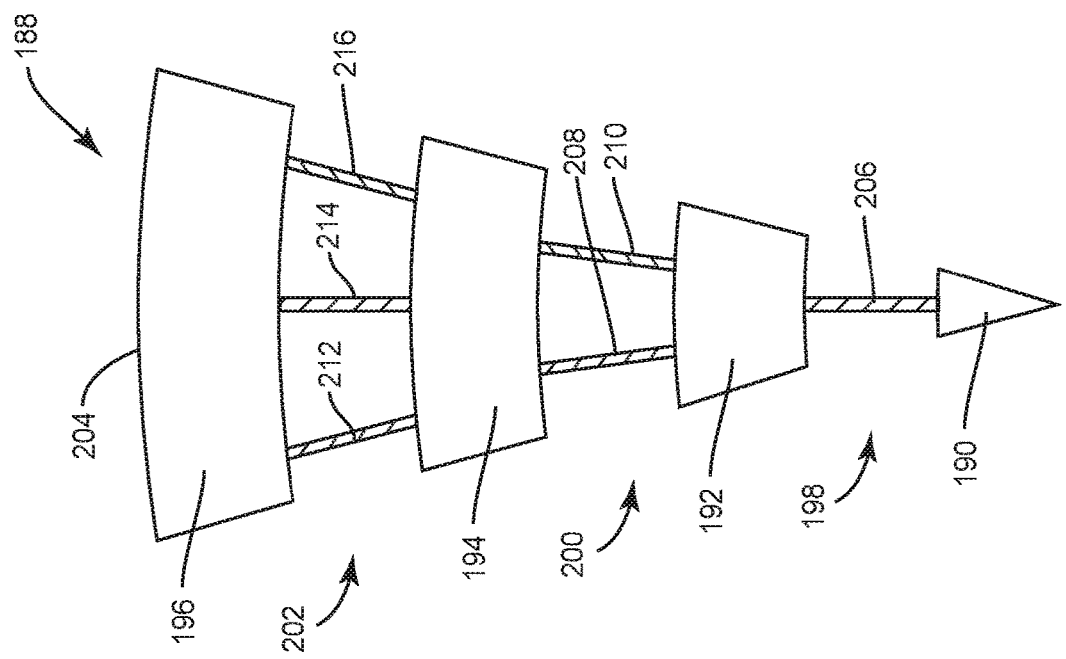
FIG. 9 is a diagram of an end view of an amplifier assembly according to some embodiments.

FIG. 9 is a diagram of an end view of an amplifier assembly 188 according to some embodiments. The end view is from an input of the amplifier assembly 188 similar to the end view of the amplifier assembly 168 of FIG. 8. The amplifier assembly 188 includes a first amplifier assembly inner conductor 190, a second amplifier assembly inner conductor 192, a third amplifier assembly inner conductor 194, and an amplifier assembly outer conductor 196. A first input opening 198 at least partially separates the first amplifier assembly inner conductor 190 from the second amplifier assembly inner conductor 192. A second input opening 200 at least partially separates the second amplifier assembly inner conductor 192 from the third amplifier assembly inner conductor 194. A third input opening 202 at least partially separates the third amplifier assembly inner conductor 194 from the amplifier assembly outer conductor 196. A body 204 of the amplifier assembly 188 generally has a wedge shape; accordingly, the second input opening 200 is larger in area than the first input opening 198, and the third input opening 202 is larger in area than the second input opening 200. A first input antenna structure 206 is coupled to the first amplifier assembly inner conductor 190 and the second amplifier assembly inner conductor 192 across the first input opening 198. A second input antenna structure 208 and a third input antenna structure 210 are coupled to the second amplifier assembly inner conductor 192 and the third amplifier assembly inner conductor 194 across the second input opening 200. A fourth input antenna structure 212, a fifth input antenna structure 214, and a sixth input antenna structure 216 are coupled to the third amplifier assembly inner conductor 194 and the amplifier assembly outer conductor 196 across the third input opening 202.

Accordingly, the amplifier assembly 188 is provided where the second input opening 200 in the body 204 comprises a plurality of input antenna structures (the second input antenna structure 208 and the third input antenna structure 210 of FIG. 9), and the third input opening 202 in the body 204 comprises a plurality of input antenna structures (the fourth input antenna structure 212, the fifth input antenna structure 214, and the sixth input antenna structure 216 of FIG. 9). In that regard, a total number of the plurality of input antenna structures in the third input opening 202 is greater than a total number of the plurality of input antenna structures in the second input opening 200. It is understood an output of the amplifier assembly 188 would be similar to the description above for the input of the amplifier assembly 188 and, accordingly, the term "input" may be replaced with the term "output." As previously described, an input coaxial waveguide section may be configured to contact the first amplifier assembly inner conductor 190 and the amplifier assembly outer conductor 196 and will thus concurrently provide a signal to the first input antenna structure 206, the second input antenna structure 208, the third input antenna structure 210, the fourth input antenna structure 212, the fifth input antenna structure 214, and the sixth input antenna structure 216. However, alternative configurations are possible. Different configurations of the input coaxial waveguide section may contact any pair of the first amplifier assembly inner conductor 190, the second amplifier assembly inner conductor 192, the third amplifier assembly inner conductor 194, and the amplifier assembly outer conductor 196 to amplify a signal concurrently along one, two, three, four, five, or six signal paths. Accordingly, different input coaxial waveguide sections can be coupled to a center waveguide section formed from a plurality of the amplifier assemblies 188 to offer different amplification factors.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device for modifying a signal comprising a plurality of amplifier assemblies, wherein each amplifier assembly of the plurality of amplifier assemblies comprises:
   a first amplifier sub-assembly comprising:
      a first amplifier;
      a first input antenna structure coupled to the first amplifier;
      and
      a first output antenna structure coupled to the first amplifier; and
   a second amplifier sub-assembly comprising:
      a second amplifier;
      a second input antenna structure coupled to the second amplifier; and
      a second output antenna structure coupled to the second amplifier.

2. The spatial power-combining device of claim 1 wherein the first amplifier comprises a first Monolithic Microwave Integrated Circuit (MMIC) amplifier and the second amplifier comprises a second MMIC amplifier.

3. The spatial power-combining device of claim 1 further comprising a center axis, and wherein the plurality of amplifier assemblies are arranged coaxially about the center axis.

4. The spatial power-combining device of claim 3 wherein for each amplifier assembly of the plurality of amplifier assemblies, the first amplifier sub-assembly and the second amplifier sub-assembly are positioned radially with respect to the center axis, the first amplifier sub-assembly positioned closer to the center axis than the second amplifier sub-assembly.

5. The spatial power-combining device of claim 1 wherein at least one amplifier assembly of the plurality of amplifier assemblies further comprises:
   a first input signal conductor extending from an end of the first input antenna structure to the first amplifier; and
   a second input signal conductor extending from an end of the second input antenna structure to the second amplifier;
   wherein the first input signal conductor extends a same distance as the second input signal conductor.

6. The spatial power-combining device of claim 1 further comprising an input coaxial waveguide section configured to concurrently provide a signal to the first input antenna structure and the second input antenna structure of each amplifier assembly of the plurality of amplifier assemblies.

7. The spatial power-combining device of claim 6 wherein the input coaxial waveguide section further comprises:
   an input waveguide inner conductor;
   an input waveguide outer conductor; and
   an input waveguide opening positioned between the input waveguide inner conductor and the input waveguide outer conductor.

8. The spatial power-combining device of claim 7 wherein each amplifier assembly of the plurality of amplifier assemblies further comprises:
   a body comprising a first amplifier assembly inner conductor, a second amplifier assembly inner conductor, and an amplifier assembly outer conductor;
   wherein the second amplifier assembly inner conductor is positioned between the first input antenna structure and the second input antenna structure; and
   wherein the second amplifier assembly inner conductor is in contact with the input waveguide outer conductor.

9. The spatial power-combining device of claim 7 wherein each amplifier assembly of the plurality of amplifier assemblies further comprises:
a body comprising a first amplifier assembly inner conductor, a second amplifier assembly inner conductor, and an amplifier assembly outer conductor;
wherein the second amplifier assembly inner conductor is positioned between the first input antenna structure and the second input antenna structure; and
wherein the amplifier assembly outer conductor is in contact with the input waveguide outer conductor.

10. The spatial power-combining device of claim 9 wherein the second amplifier assembly inner conductor is neither in contact with the input waveguide inner conductor nor the input waveguide outer conductor.

11. The spatial power-combining device of claim 9 further comprising:
a third amplifier;
a third input antenna structure coupled to the third amplifier; and
a third output antenna structure coupled to the third amplifier.

12. The spatial power-combining device of claim 11 wherein the body further comprises a third amplifier assembly inner conductor that is positioned between the second input antenna structure and the third input antenna structure.

13. The spatial power-combining device of claim 1 further comprising an output coaxial waveguide section configured to concurrently combine signals transmitted from the first output antenna structure and the second output antenna structure of each amplifier assembly of the plurality of amplifier assemblies to form a combined output signal.

14. The spatial power-combining device of claim 13 wherein the output coaxial waveguide section further comprises:
an output waveguide inner conductor;
an output waveguide outer conductor; and
an output waveguide opening positioned between the output waveguide inner conductor and the output waveguide outer conductor.

15. The spatial power-combining device of claim 14 wherein each amplifier assembly of the plurality of amplifier assemblies further comprises:
a body comprising a first amplifier assembly inner conductor, a second amplifier assembly inner conductor, and an amplifier assembly outer conductor;
wherein the second amplifier assembly inner conductor is positioned between the first output antenna structure and the second output antenna structure; and
wherein the amplifier assembly outer conductor is in contact with the output waveguide outer conductor.

16. The spatial power-combining device of claim 14 wherein each amplifier assembly of the plurality of amplifier assemblies further comprises:
a body comprising a first amplifier assembly inner conductor, a second amplifier assembly inner conductor, and an amplifier assembly outer conductor;
wherein the second amplifier assembly inner conductor is positioned between the first output antenna structure and the second output antenna structure; and
wherein the second amplifier assembly inner conductor is in contact with the output waveguide outer conductor.

17. A spatial power-combining device structure comprising a first amplifier assembly structure, wherein the first amplifier assembly structure comprises:
a wedge-shaped body, comprising:
a first amplifier assembly inner conductor;
a second amplifier assembly inner conductor, and
an amplifier assembly outer conductor;
wherein the second amplifier assembly inner conductor is at least partially separated from the first amplifier assembly inner conductor and the amplifier assembly outer conductor.

18. The spatial power-combining device structure of claim 17 wherein the wedge-shaped body further comprises:
a first input opening that at least partially separates the second amplifier assembly inner conductor from the first amplifier assembly inner conductor; and
a second input opening that at least partially separates the second amplifier assembly inner conductor from the amplifier assembly outer conductor.

19. The spatial power-combining device structure of claim 18 further comprising a first input antenna structure coupled to the first amplifier assembly inner conductor and the second amplifier assembly inner conductor across the first input opening.

20. The spatial power-combining device structure of claim 19 further comprising a second input antenna structure coupled to the second amplifier assembly inner conductor and the amplifier assembly outer conductor across the second input opening.

21. The spatial power-combining device structure of claim 20 further comprising:
a plurality of amplifier assembly structures that include the first amplifier assembly structure and a center axis;
wherein the plurality of amplifier assembly structures are arranged coaxially about the center axis.

22. The spatial power-combining device structure of claim 21 wherein the first input opening of each amplifier assembly structure of the plurality of amplifier assembly structures collectively forms a first cylindrical opening.

23. The spatial power-combining device structure of claim 22 wherein the second input opening of each amplifier assembly structure of the plurality of amplifier assembly structures collectively forms a second cylindrical opening that is positioned farther away from the center axis than the first cylindrical opening.

24. The spatial power-combining device structure of claim 18 further comprising:
a third amplifier assembly inner conductor;
a third input opening that at least partially separates the third amplifier assembly inner conductor from the amplifier assembly outer conductor;
a first input antenna structure coupled to the first amplifier assembly inner conductor and the second amplifier assembly inner conductor across the first input opening;
a second input antenna structure coupled to the second amplifier assembly inner conductor and the third amplifier assembly inner conductor across the second input opening; and
a third input antenna structure coupled to the third amplifier assembly inner conductor and the amplifier assembly outer conductor across the third input opening.

25. The spatial power-combining device structure of claim 24 further comprising:
a plurality of second input antenna structures that include the second input antenna structure; and
a plurality of third input antenna structures that include the third input antenna structure.

26. The spatial power-combining device structure of claim 25 wherein a total number of the plurality of third input antenna structures is greater than a total number of the plurality of second input antenna structures.

27. A spatial power-combining device for modifying a signal comprising a plurality of amplifier assemblies, wherein each amplifier assembly of the plurality of amplifier assemblies comprises:
   a plurality of amplifiers;
   wherein the plurality of amplifiers are configured to concurrently amplify an input signal in parallel with each other within each amplifier assembly.

28. The spatial power-combining device of claim 27 further comprising:
   an input coaxial waveguide section configured to provide the input signal;
   wherein each amplifier assembly of the plurality of amplifier assemblies is configured to concurrently split the input signal received from the input coaxial waveguide section into a plurality of input signal portions; and
   wherein each input signal portion of the plurality of input signal portions corresponds to a separate amplifier of the plurality of amplifiers.

29. The spatial power-combining device of claim 28 wherein each amplifier of the plurality of amplifiers is configured to concurrently amplify a corresponding input signal portion to generate corresponding amplified output signal portions and concurrently provide the corresponding amplified output signal portions to an output coaxial waveguide section.

30. The spatial power-combining device of claim 27 wherein the plurality of amplifiers comprises a first amplifier, a second amplifier, and a third amplifier configured to concurrently amplify a signal in parallel with each other.

31. The spatial power-combining device of claim 30 wherein the plurality of amplifiers further comprises a fourth amplifier and the first amplifier, the second amplifier, the third amplifier, and the fourth amplifier are configured to concurrently amplify a signal in parallel with each other.

* * * * *

UNITED STATES PATENT AND TRADEMARK OFFICE
CERTIFICATE OF CORRECTION

PATENT NO. : 10,615,482 B2
APPLICATION NO. : 15/933783
DATED : April 7, 2020
INVENTOR(S) : Ankush Mohan et al.

Page 1 of 1

It is certified that error appears in the above-identified patent and that said Letters Patent is hereby corrected as shown below:

In the Specification

Column 1, Line 5, insert the following paragraph:
--This application claims the benefit of U.S. provisional patent application Ser. Nos. 62/548,447, 62/548,448, 62/548,457, 62/548,464, and 62/548,472, all of which were filed on August 22, 2017, the disclosures of which are incorporated herein by reference in their entireties.--

Signed and Sealed this
Twenty-third Day of June, 2020

Andrei Iancu
*Director of the United States Patent and Trademark Office*